United States Patent
Brun et al.

(10) Patent No.: US 8,611,101 B2
(45) Date of Patent: Dec. 17, 2013

(54) ASSEMBLY OF A MICROELECTRONIC CHIP HAVING A GROOVE WITH A WIRE ELEMENT IN THE FORM OF A STRAND, AND METHOD FOR ASSEMBLY

(75) Inventors: Jean Brun, Champagnier (FR); Sophie Verrun, Grenoble (FR); Dominique Vicard, Saint Nazaire les Eymes (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 256 days.

(21) Appl. No.: 13/124,762

(22) PCT Filed: Oct. 21, 2009

(86) PCT No.: PCT/FR2009/001231
§ 371 (c)(1),
(2), (4) Date: Apr. 18, 2011

(87) PCT Pub. No.: WO2010/046563
PCT Pub. Date: Apr. 29, 2010

(65) Prior Publication Data
US 2011/0198735 A1     Aug. 18, 2011

(30) Foreign Application Priority Data

Oct. 21, 2008 (FR) .................................... 08 05832

(51) Int. Cl.
*H01R 9/00* (2006.01)
*H01R 43/00* (2006.01)
(52) U.S. Cl.
USPC .......................................... 361/772; 29/868
(58) Field of Classification Search
USPC ........................................................ 361/772
See application file for complete search history.

(56) References Cited

U.S. PATENT DOCUMENTS

| | | | | |
|---|---|---|---|---|
| 3,736,366 A | * | 5/1973 | Wittenberg | .................... 174/34 |
| 4,417,096 A | * | 11/1983 | Willette | .................... 174/71 R |
| 4,471,415 A | * | 9/1984 | Larson et al. | ............ 362/249.14 |
| 4,741,707 A | * | 5/1988 | Mondor, III | .................. 439/417 |
| 4,990,971 A | * | 2/1991 | Le Creff | ........................ 257/88 |
| 4,999,755 A | * | 3/1991 | Lin | ........................ 362/217.02 |
| 5,025,555 A | * | 6/1991 | Mase | .............................. 29/840 |

(Continued)

FOREIGN PATENT DOCUMENTS

| FR | 2 917 895 A1 | 12/2008 |
|---|---|---|
| WO | WO 2008/025889 A1 | 3/2008 |
| WO | WO 2009/013409 A2 | 1/2009 |
| WO | WO 2009/112644 A1 | 9/2009 |

OTHER PUBLICATIONS

International Search Report issued in International Application No. PCT/FR2009/001231 on Feb. 16, 2010 (with translation).

(Continued)

*Primary Examiner* — Bradley Thomas
*Assistant Examiner* — Theron Milliser
(74) *Attorney, Agent, or Firm* — Oliff & Berridge, PLC

(57) ABSTRACT

Assembly of at least one microelectronic chip with a wire element, the chip comprising a groove for embedment of the wire element. The wire element is a strand with a longitudinal axis substantially parallel to the axis of the groove, comprising at least two electrically conducting wires covered with insulator. The chip comprises at least one electrically conducting bump in the groove, this bump being in electric contact with a stripped area of a single one of the electrically conducting wires of the strand.

18 Claims, 4 Drawing Sheets

(56) References Cited

U.S. PATENT DOCUMENTS

| | | | |
|---|---|---|---|
| 5,072,519 A * | 12/1991 | Mase | 29/840 |
| 5,475,241 A * | 12/1995 | Harrah et al. | 257/99 |
| 5,957,564 A * | 9/1999 | Bruce et al. | 362/84 |
| 6,050,845 A * | 4/2000 | Smalley et al. | 439/417 |
| 6,087,680 A * | 7/2000 | Gramann et al. | 257/91 |
| 6,716,038 B2 * | 4/2004 | Garcia | 439/75 |
| 6,822,168 B2 * | 11/2004 | Klesing et al. | 174/254 |
| 7,128,438 B2 * | 10/2006 | Ratcliffe | 362/236 |
| 7,207,693 B2 * | 4/2007 | Ratcliffe | 362/236 |
| 7,320,616 B1 * | 1/2008 | Legrady et al. | 439/404 |
| 7,525,816 B2 * | 4/2009 | Sawachi | 361/792 |
| 7,604,498 B2 * | 10/2009 | Mahajan | 439/410 |
| 7,745,253 B2 * | 6/2010 | Luechinger | 438/106 |
| 8,012,795 B2 * | 9/2011 | Brun et al. | 438/107 |
| 8,093,617 B2 * | 1/2012 | Vicard et al. | 257/99 |
| 8,258,044 B2 * | 9/2012 | Brun et al. | 438/460 |
| 8,269,112 B2 * | 9/2012 | Lee et al. | 174/254 |
| 8,337,263 B2 * | 12/2012 | Freakes | 439/877 |
| 8,375,563 B2 * | 2/2013 | Vicard | 29/601 |
| 8,382,534 B2 * | 2/2013 | Lenhert et al. | 439/843 |
| 2002/0066584 A1 * | 6/2002 | Kurita | 174/52.1 |
| 2002/0155759 A1 * | 10/2002 | Ruiz et al. | 439/623 |
| 2002/0160648 A1 * | 10/2002 | Bulmer et al. | 439/393 |
| 2004/0023530 A1 * | 2/2004 | Garcia | 439/75 |
| 2004/0217488 A1 * | 11/2004 | Luechinger | 257/784 |
| 2005/0223552 A1 | 10/2005 | Meyer et al. | |
| 2006/0177965 A1 * | 8/2006 | Senda | 438/108 |
| 2007/0155219 A1 * | 7/2007 | Freakes | 439/395 |
| 2009/0200066 A1 * | 8/2009 | Vicard et al. | 174/255 |
| 2009/0227069 A1 * | 9/2009 | Brun et al. | 438/113 |
| 2011/0001237 A1 * | 1/2011 | Brun et al. | 257/737 |
| 2011/0149540 A1 * | 6/2011 | Brun et al. | 361/783 |
| 2011/0198735 A1 * | 8/2011 | Brun et al. | 257/622 |
| 2011/0247198 A1 * | 10/2011 | Vicard | 29/601 |
| 2011/0287606 A1 * | 11/2011 | Brun et al. | 438/460 |
| 2012/0064671 A1 * | 3/2012 | Brun et al. | 438/118 |

OTHER PUBLICATIONS

Sep. 9, 2013 English language version of Second Office Action issued in Chinese Patent Application No. 200980141702.9.

* cited by examiner

ASSEMBLY OF A MICROELECTRONIC CHIP HAVING A GROOVE WITH A WIRE ELEMENT IN THE FORM OF A STRAND, AND METHOD FOR ASSEMBLY

BACKGROUND OF THE INVENTION

The invention relates to an assembly of at least one microelectronic chip with a wire element, the chip comprising a longitudinal groove for embedding the wire element.

STATE OF THE ART

Numerous techniques exist at the present time for mechanically and electrically connecting microelectronic chips to one another. A conventional technique consists in making a rigid mechanical connection between the chips, once the chips have been formed on a substrate and released by dicing. The chips, then fixed on a rigid support, are then electrically connected before a protective coating is formed. This approach, consisting in performing connection on a rigid support, is conventionally used when there is a great complexity in connection of the chips. However, this approach has the major drawback of using a rigid mechanical support which is particularly unsuitable for integration in flexible structures.

The document WO2008/025889 filed by the applicant describes a micro-electronic chip comprising two parallel main surfaces 1, 2 and lateral surfaces 3a, 3b joining the two main surfaces 1 and 2, as illustrated in FIG. 1. At least one of the lateral surfaces 3a, 3b comprises a groove 4 provided with an electric connection element (not shown) and forming a housing for a wire element 5. The electric connection element is achieved by metallization of the groove 4. Wire element 5 is then secured to the groove 4 by welding with addition of material, by electrolysis, by sticking, or by embedding. If the microelectronic chip needs two independent data busses, this requires two grooves to be made on two independent lateral surfaces, each groove 4 comprising a distinct electric connection element. The two data busses are thus achieved by association of two electrically conducting wire elements 5 arranged in two distinct grooves. This does not give rise to production problems so long as the number of data busses is not multiplied. If the chip needs ten or so distinct connections, it will not in fact be possible to achieve these connections unless connection terminals are added on the main surfaces 1 and 2 overloading the microelectronic chip and reducing the flexibility of the assembly. Furthermore, in the case where an assembly comprises several chips connected to one another by a wire element, these chips have to share the same data bus.

OBJECT OF THE INVENTION

The object of the invention is to achieve an assembly between a wire element and a chip that does not present the drawbacks of the prior art.

This object is tended to be achieved by the fact that the wire element is a strand of longitudinal axis substantially parallel to the axis of the groove, comprising at least two electrically conducting wire covered with insulator, and that, in the groove, the chip comprises at least one electrically conducting bump, this bump being in electric contact with a stripped area of only one of the electrically conducting wires of the strand.

According to a first alternative embodiment, the assembly comprises at least two chips connected by the strand, one electrically conducting wire of the strand being in contact with a bump of a single chip.

According to a second alternative embodiment, an electrically conducting wire of the strand is in contact with a bump of at least two chips.

According to another alternative embodiment, said chip comprises as many bumps as distinct electrically conducting wires of the strand, each bump being in electric contact with an associated wire of the strand.

According to a development, each bump is arranged on at least a first side wall of the groove and forms means for blocking the strand in the groove by pinching the strand between each bump and a second side wall of the groove opposite said bump.

It is a further object of the invention to provide a method for performing assembly of a microelectronic chip having a groove with a wire element in the form of a strand. This method comprises formation of a strand embedded in the groove, said strand being blocked by pinching between each bump and the side wall opposite said bump, and stripping of an area of the electrically conducting wire of the strand designed to come into contact with the corresponding bump.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

Microelectronic chips can be used to form an assembly of chips in the form of daisy chains. The chips are then connected to one another by a wire element. The chips used in this kind of application preferably have dimensions smaller than 5 mm, or even smaller than 1 mm. An assembly according to the invention is in fact more particularly interesting for chips of small dimensions as handling and connection of the latter are made easier.

Figure 1:
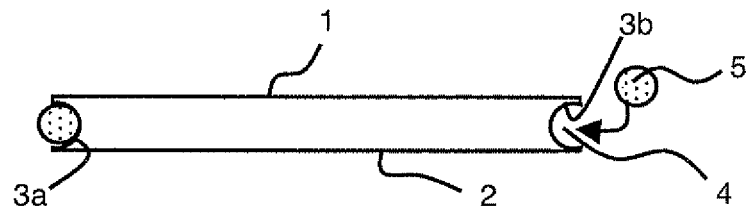
FIG. 1 illustrates a microelectronic chip connected to wire elements by embedding in a groove according to the prior art.
Figure 2:
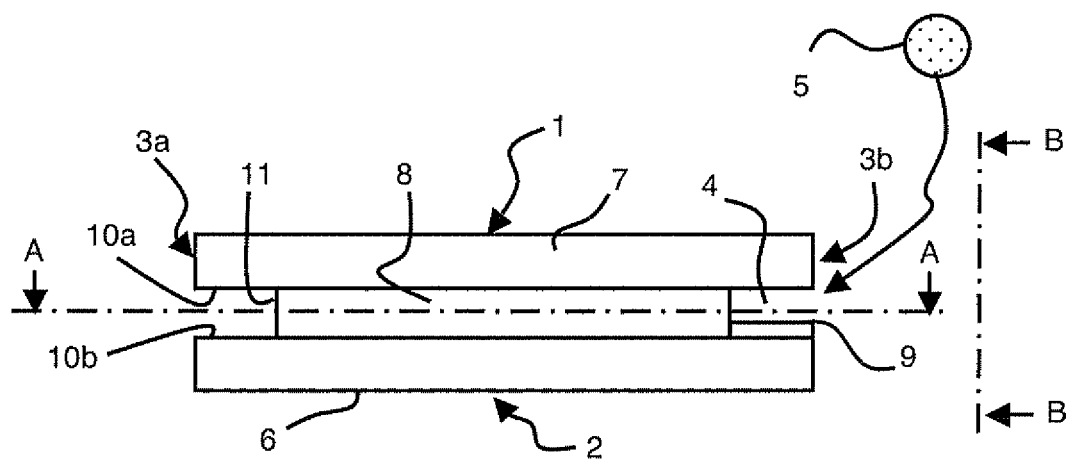
FIG. 2 illustrates an example of a microelectronic chip used to achieve the assembly according to the invention, in side view.
Figure 3:
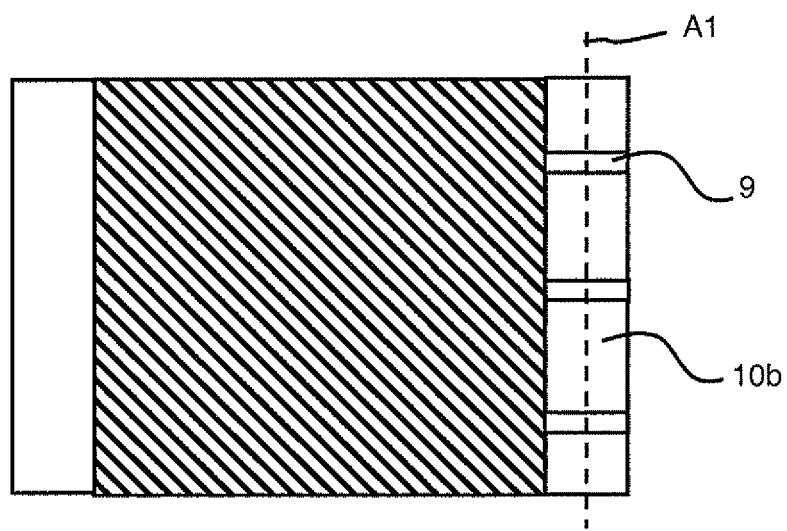
FIG. 3 illustrates a microelectronic chip, in a cross-section along A-A of FIG. 2.

As illustrated in FIG. 2, such a microelectronic chip comprises for example two main surfaces 1, 2 and lateral surfaces 3a and 3b joining the two main surfaces 1 and 2. At least one of the lateral surfaces 3a, 3b comprises a longitudinal groove 4 for embedding wire element 5. Groove 4 is delineated by two side walls 10a and 10b able to be joined to the bottom of groove 4 by a face 11.

This type of chip can come in the form of an assembly of two microelectronic components, or of a microelectronic component 6 and a counterplate 7 as in FIG. 2. The two components, or the component and counterplate, have substantially the same dimensions and are joined to one another by a spacer 8. Spacer 8 having smaller dimensions than those of microelectronic component 6, placement thereof enables at least one groove 4 to be obtained naturally. A chip can also comprise two grooves situated on each side of spacer 8, as illustrated in FIG. 2. Assembly with spacer 8 enables grooves 4 to be obtained by assembly of the chip, avoiding a machining step which would be complex and risky for the integrity of the chip when fabrication is performed. Grooves 4 are then U-shaped and delineated by the two side walls 10a and 10b, which can be substantially parallel, joined to one another by face 11 forming the bottom of groove 4. Counterplate 7 can be made from glass, composite material, etc.

A chip is designed to be connected by a wire element 5 formed by at least two electrically conducting wires, insulated from one another, forming a strand. What is meant by a strand is an assembly of at least two wires twisted together. Each groove 4 of each chip then comprises at least one electrically conducting bump 9, bump 9 being in electric contact with a stripped area of only one of the electrically conducting wires of the strand after assembly of wire element 5 with the microelectronic chip. Once in place, wire element 5 can be secured to the groove by simple sticking, for example by inserting an epoxy glue in the groove.

Electric insulation of the electrically conducting wires forming the strand is preferably achieved by an insulating deposit which coats each electrically conducting wire. This insulating deposit can be organic, for example a thermoplastic, an epoxy glue, and/or mineral, for example $SiO_2$ or alumina. Thus, when the strand is inserted in groove 4, the insulating deposit covering each electrically conducting wire is pierced when the wire is solicited with its bump 9. The wire is then in electric contact with the corresponding bump at the level of a stripped area 12 (FIG. 4) and insulated outside this area 12. Soliciting wire element 5 against corresponding bump 9 when the wire element is inserted enables the wire to be scratched at the level of contact area 12 thereby automatically stripping an area of the wire.

Figure 8:
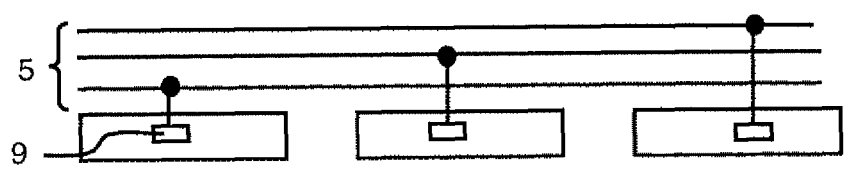
FIGS. 8, 9 and 10 schematically illustrate types of possible electric connections of an assembly.

An assembly can comprise at least two chips connected by the strand. In a situation where it is sought for each chip to be connected to its own wire, each electrically conducting wire of the strand is in contact with a bump 9 of a single respective chip. According to the particular example illustrated in FIG. 8, three chips are connected by a wire element 5 in the form of a strand comprising three electrically conducting wires, each electrically conducting wire being electrically connected to a single chip by means of connection bump 9. A chip then comprises a totally independent data bus. This principle can naturally be applied to a plurality of chips, the strand then comprising as many electrically conducting wires as the assembly comprises chips.

Figure 9:
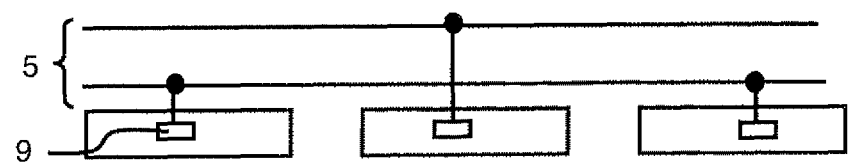

According to an alternative embodiment, an electrically conducting wire of the strand is in electric contact with a bump 9 of at least two chips. Thus, as illustrated in FIG. 9, the assembly comprises three chips and the chips of each end of the assembly share the same electrically conducting wire acting for example as common data bus.

Figure 10:
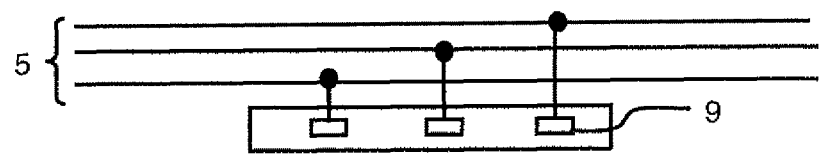

According to another alternative embodiment, a chip can comprise as many bumps as electrically conducting wires of the strand. In the case of the particular example illustrated in FIG. 10, the chip comprises three bumps 9 and strand 5 is formed by three electrically conducting wires, Each bump 9 is in electric contact with a single electrically conducting wire of the strand enabling the connections to be multiplied for the same chip.

Naturally, the three examples of assembly described above are not restrictive. Any type of assembly and connection can in fact be envisaged, the different types in particular being able to be used in combination. An electrically conducting wire constituting the strand can correspond to a data bus or to a power supply connection.

In the case where the insulating deposit is a thermoplastic, when the strand has been inserted in groove 4 and bumps 9 are in intimate contact with the corresponding wire, the assembly obtained can be heated to block the strand in groove 4, while at the same time preserving the electric insulation between the different wires forming the strand.

Figure 4:
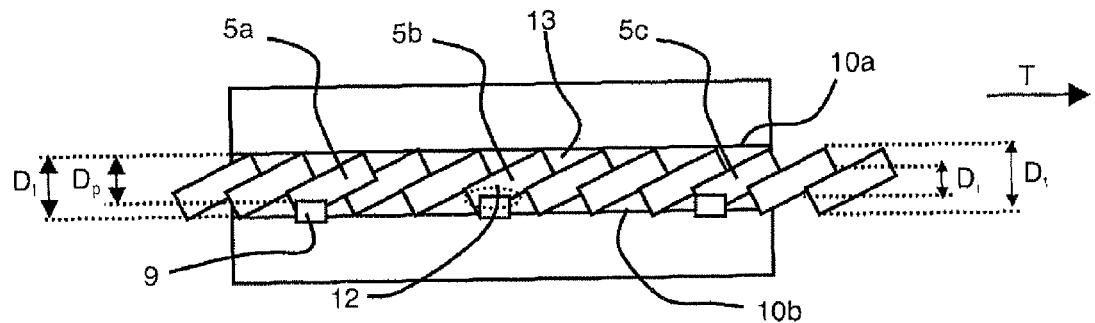
FIG. 4, according to a view B-B of FIG. 2, illustrates a microelectronic chip in which a wire element in the form of a strand has been inserted.
Figure 5:
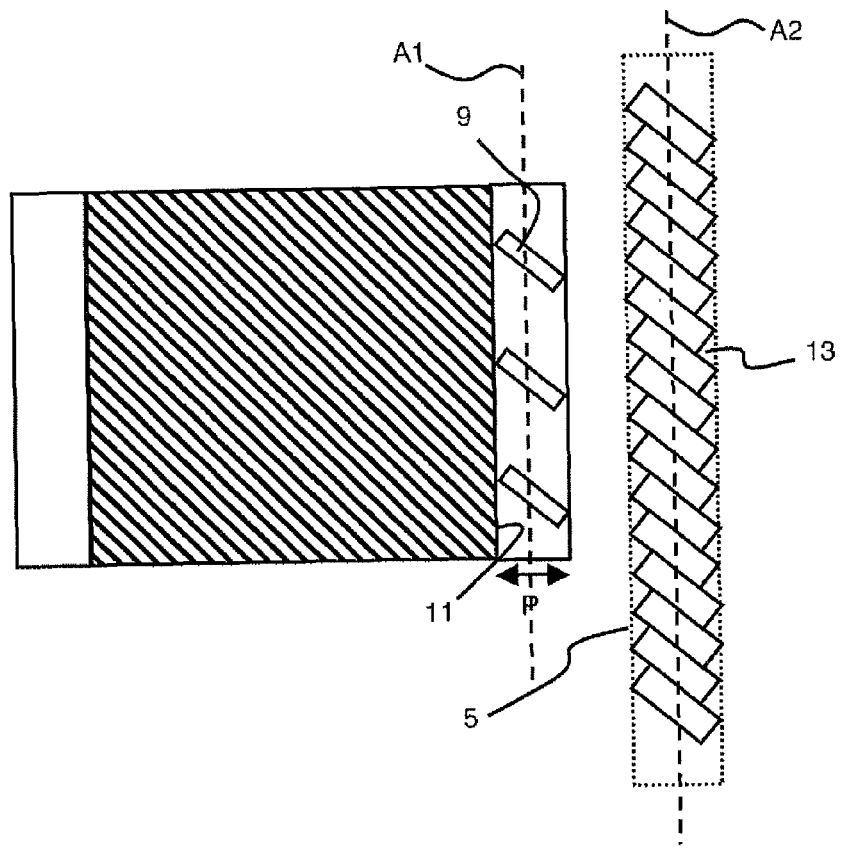
FIG. 5 illustrates an alternative embodiment of the connection bumps in the groove, in a cross-section similar to the cross-section A-A of FIG. 2.

According to a development illustrated in FIGS. 2 to 5, bumps 9 are arranged on at least one of side walls 10a, 10b of groove 4 and form blocking means by pinching the strand between each bump 9 and side wall 10a of groove 4 opposite the corresponding bump 9. Bumps 9 act as mechanical pinchers when a strand is inserted in groove 4. Thus, as illustrated in FIG. 4, the strand comprises for example three electrically conducting wires 5a, 5b and 5c. Torsion of these three wires to make the strand naturally generated gaps 13 between the electrically conducting wires spirally wound around a longitudinal axis of strand $A_2$ (FIG. 5). Gaps 13 represent empty spaces between two adjacent wires at the level of the outer surface of the strand.

The diameter $D_i$ of the strand at the level of gaps 13 is smaller than the maximum diameter $D_t$ of the strand and smaller than the distance $D_p$ separating bumps 9 from side wall 10a of the groove opposite said bumps 9. The maximum diameter $D_t$ of the strand is larger than the distance $D_p$ while remaining smaller than or equal to the distance $D_l$ separating the two side walls 10a and 10b. Thus, when the strand is inserted in groove 4, the strand is preferably placed such that bumps 9 are facing gaps 13, enabling the strand to be inserted in groove 4 without being forced. For this, gaps 13 have to be able to accommodate a bump 9 without any friction. Once the strand has been inserted, the latter is subjected to a tractive force T applied along a longitudinal axis $A_1$ (FIG. 3) of groove 4, enabling wires 5a, 5b and 5c of the strand to come into contact (area 12) with their respective bumps 9 and to achieve stripping of the electrically conducting wires of the strand at the level of contact area 12. Traction also enables the strand to be blocked by pinching between bumps 9, placed on side wall 10b of groove 4, and side wall 10a of groove 4 opposite bumps 9. Jamming of the strand by pinching enables the latter to be secured in groove 4.

For securing by pinching to be efficient, it is preferable for the material composing the electrically conducting wires of the strand to be more malleable than the materials constituting bumps 9 and side wall 10a of groove 4 opposite bumps 9 or vice-versa. For example purposes, the wires can be made from silver, aluminum or copper. The side wall opposite the bump can be made from silicon, glass, epoxy or possibly by layers of silicon oxide or silicon nitride in thicknesses comprised between 500 and 5 µm. The bumps can be made from nickel, copper or tungsten covered by a gold film.

Bumps 9 situated at the level of groove 4 can have different shapes. For example, as illustrated in FIG. 5, they can have an elongate shape and be arranged inclined with respect to longitudinal axis $A_1$ of groove 4. The incline of bumps 9 is preferably parallel to the local incline of gaps 13 of the strand to facilitate insertion of the strand, without forcing, in groove 4. The incline of bumps 9 then depends on the pitch of the twist of the strand. The more twisted the strand the smaller the pitch of the twist in fact becomes, i.e. the local axis of the gaps tends to move close to the perpendicular in the direction of longitudinal axis $A_2$ of the strand. Securing of the strand in groove 4 is then performed by traction of the strand. As described in the foregoing, traction enables the strand to be pinched between each bump 9 and side wall 10a of groove 4 opposite bump 9. The use of inclined bumps 9 means that, when traction takes place, the strand is pressed naturally against the bottom of groove 4. Traction of the strand further enables bump 9 to cut the insulating deposit of the corresponding electrically conducting wire and to create the contact at the level of the interface between bump 9 and the corresponding electrically conducting wire.

To improve the contact between the wire and its bump 9 at the level of contact area 12, bumps 9 are preferably sharp to enhance stripping of the wires and penetration.

The groove can comprise certain bumps designed solely to improve blocking of the strand in the groove by pinching between bump 9 and side wall 10a of groove 4 opposite said bump 9. This means that these bumps are not active.

The strand can also comprise non-conducting threads to increase the strength of the assembly.

In the case where the microelectronic chip is composed of two electronic components 6, a groove can comprise bumps 9 on each of its side walls 10a and 10b. The electronic components can then share certain data busses or be connected distinctly from one another.

In a general manner, the assembly method comprises formation of a strand embedded in groove 4. The strand is blocked by pinching between each bump 9 and the opposite side wall 10a. The strand is stripped at the level of an area 12 of the electrically conducting wire designed to come into contact with said bump.

Stripping is either caused by the embedment itself, i.e. the strand is embedded and pinched when it is inserted in groove 4, or after the strand has been embedded in the groove by traction of the latter along longitudinal axis A1 of groove.

Figure 6:
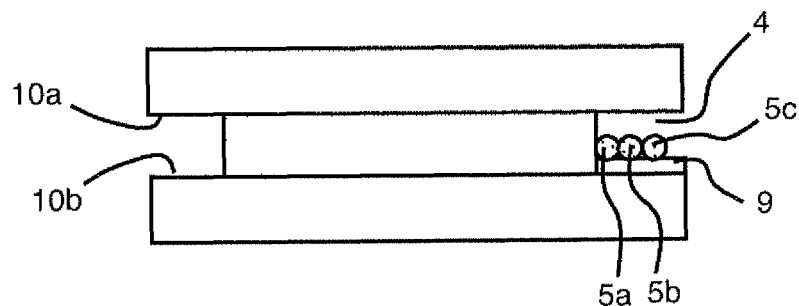
FIGS. 6 and 7 illustrate a method for connecting a microelectronic chip with a wire element.
Figure 7:
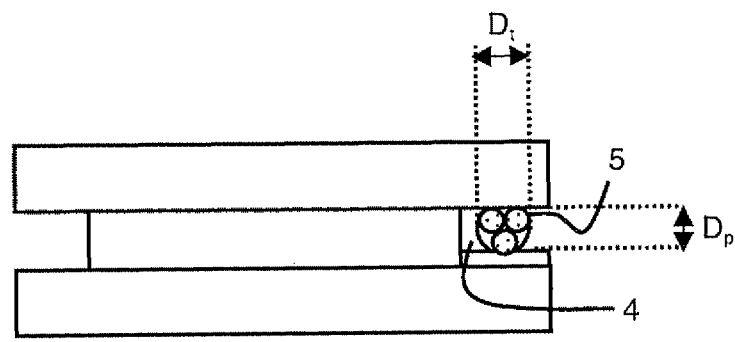

According to a development, stripping is performed after the strand has been embedded in the groove by traction of the latter along longitudinal axis A1 of groove. According to an alternative embodiment, the method for performing assembly comprises insertion of the electrically conducting wires in groove 4 between each electrically conducting bump 9 and the opposite side wall 10a. Then twisting of the wires enables the strand to be formed directly in groove 4. Finally, longitudinal traction of the strand enables stripped areas to be formed on each wire, enabling electric contact of an electrically conducting wire with an associated bump 9. Concomitantly with stripping, traction blocks the strand by pinching between bump 9 and second side wall 10a of the groove opposite said bump. A particular example is illustrated with the help of FIGS. 6 and 7. The microelectronic chip thus comprises three elongate bumps the length of which is smaller than or equal to the depth P of groove 4. These bumps are perpendicular to the face 11 forming the bottom of groove 4. According to the example, three electrically conducting wires 5a, 5b, 5c electrically insulated from one another are inserted side by side in groove 4 (FIG. 6). The diameter of each wire 5a, 5b, 5c being smaller than distance $D_p$ separating bump 9 of the opposite side wall 10a, wires 5a, 5b, 5c are inserted without any effort in groove 4. The three wires are then twisted directly in groove 4 to form the strand (FIG. 7). The force exerted between the wires when the strand is made is sufficient to produce a force that tends to press the conducting wires against bumps 9 to be connected. The pitch of the twist is adjusted so that each wire comes into contact with a distinct bump. Stripping on an area of each wire is then achieved by traction T of the strand along longitudinal axis A1 of groove 4. Traction also enables the strand to be blocked by pinching between each bump 9 and side wall 10a of groove 4 opposite said bump 9.

Advantageously, the link between a wire and a bump 9 can be strengthened by chemical or electrochemical means. Embedment of a strand in a groove 4 can also be consolidated by electrolysis or by insertion of an electrically insulating epoxy glue in the groove. Numerous variants and modifications of the embodiments described here will be apparent to the person skilled in the trade. Bumps 9 made on the lateral surfaces of the groove to establish electric contact with the wires of the strand have been described for example purposes. Other means for establishing the contact can be envisaged, for example vias salient from the bottom of the groove which enter the wires of the strand pressing the strand against the bottom of the groove. Although a groove obtained by assembly of electronic components has been described, a groove made in the bulk of the chip, for example by cutting or etching, can also be envisaged. Furthermore, the groove housing the strand can be provided on any surface of the chip. The surfaces of the chip can further have various shapes, for example flat or convex.

The invention claimed is:

1. An assembly comprising:
   at least a first and a second microelectronic chip with a wire element, wherein
   the wire element is a strand including at least first and second different electrically conducting wires each covered with an insulator, the wire element being embedded in a groove of each microelectronic chip and having a longitudinal axis substantially parallel to the axis of the grooves,
   each chip includes at least one electrically conducting bump in the groove, the at least one bump of the first chip being in contact with the first electrically conducting wire of the strand, and the at least one bump of the second chip being in contact with the second electrically conducting wire of the strand, and
   the at least one bump of the first chip corresponds to the first electrically conducting wire, and the at least one bump of the second chip corresponds to the second electrically conducting wire such that each chip is connected to only one wire of the strand.

2. The assembly according to claim 1, wherein each chip comprises two parallel main surfaces and lateral surfaces, at least one of the lateral surfaces of one of the chips comprising a longitudinal groove for embedment of the wire element.

3. The assembly according to claim 1, wherein one of the first and second electrically conducting wires of the strand is in contact with the bumps of one of the first and second microelectronic chips.

4. The assembly according to claim 1, wherein each bump is arranged on at least a first side wall of the groove and is configured for blocking the strand in the groove by pinching the strand between each bump and a second side wall of the groove opposite said bump.

5. The assembly according to claim 4, wherein each bump has an elongate shape and is arranged in inclined manner with respect to the longitudinal axis of the groove.

6. A method for fabricating an assembly of at least a first and second microelectronic chip with a wire element, comprising:
   providing the wire element including first and second electrically conducting wires each covered with an insulator,
   providing the at least first and second microelectronic chips, each microelectronic chip including a groove and at least one electrically conducting bump being arranged on a first side wall of the groove, and embedding the wire element in the groove of the at least first and second microelectronic chips wherein
the wire element forms a strand,
a longitudinal axis of the strand is substantially parallel to the longitudinal axis of the grooves,
said strand is blocked in the grooves of the at least first and second microelectronic chips by pinching between the at least one electrically conducting bump and a second side wall of the groove opposite said bump.
a bump of the first microelectronic chip electrically contacts the first electrically conducting wire of the strand,
a bump of the second microelectronic chip electrically contacts the second electrically conducting wire of the strand, and
the at least one bump of the first chip corresponds to the first electrically conducting wire, and the at least one bump of the second chip corresponds to the second electrically conducting wire such that each chip is connected to only one wire of the strand.

7. The method according to claim 6, comprising stripping the insulator during embedding the strand in the groove for contacting the at least one electrically conducting bump with one of the first and second electrically conducting wires.

8. The method according to claim 6, comprising stripping the insulator after embedding the strand in the groove by traction of the strand along the longitudinal axis of the groove.

9. The method according to claim 6, wherein the embedded strand is formed by torsion after insertion of the wires constituting the strand in the groove, stripping and blocking by pinching then being performed by traction of the strand.

10. An assembly comprising:
at least one microelectronic chip with a wire element, wherein
the wire element is a strand including at least first and second different electrically conducting wires each covered with an insulator, the wire element being embedded in a groove of the microelectronic chip and having a longitudinal axis substantially parallel to the axis of the groove,
the at least one microelectronic chip comprises at least two electrically conducting bump disposed in the groove, a first bump being in contact with a first electrically conducting wire of the strand, and a second bump being in contact with a second electrically conducting wire of the strand different from the first electrically conducting wire, and
the first bump corresponds to the first electrically conducting wire, and the second bump corresponds to the second electrically conducting wire such that each wire is connected to only one bump of the at least one microelectronic chip.

11. The assembly according to claim 10, wherein the at least one microelectronic chip comprises two parallel main surfaces and lateral surfaces, at least one of the lateral surfaces comprising a longitudinal groove for embedding of the wire element.

12. The assembly according to claim 10, wherein an electrically conducting wire of the strand is in electrical contact with the electrically conducting bumps of at least two chips.

13. The assembly according to claim 10, wherein each electrically conducting bump is arranged on at least a first side wall of the groove and is configured for blocking the strand in the groove by pinching the strand between each electrically conducting bump and a second side wall of the groove opposite said electrically conducting bump.

14. The assembly according to claim 13, wherein each electrically conducting bump has an elongate shape and is arranged in inclined manner with respect to the longitudinal axis of the groove.

15. A method for fabricating an assembly of at least one microelectronic chip with a wire element comprising:
providing the wire element including first and second electrically conducting wires each covered with an insulator,
providing the at least one microelectronic chip including a groove and at least two electrically conducting bumps arranged in the groove, and
embedding the wire element in the groove of the at least one microelectronic chip, wherein
the wire element forms a strand,
a longitudinal axis of the strand is substantially parallel to the longitudinal axis of the grooves,
said strand is blocked in the grooves of the at one microelectronic chip by pinching between each of the at least two electrically conducting bumps and a at least one side wall of the groove opposite said at least two electrically conducting bumps,
a first bump of the at least two electrically conducting bumps electrically contacts the first electrically conducting wire of the strand,
a second bump of the at least two electrically conducting bumps electrically contacts the second electrically conducting wire of the strand, and
the first bump corresponds to the first electrically conducting wire, and the second bump corresponds to the second electrically conducting wire such that each wire is connected to only one bump of the at least one microelectronic chip.

16. The method according to claim 15, comprising stripping the insulator during embedding the strand in the groove for contacting the at least two electrically conducting bumps with first and second electrically conducting wires.

17. The method according to claim 15, comprising stripping the insulator after embedding the strand in the groove by traction of the strand along the longitudinal axis of the groove.

18. The method according to claim 15, wherein the embedded strand is formed by torsion after insertion of the wires constituting the strand in the groove, stripping and blocking by pinching then being performed by traction of the strand.

* * * * *